(12) United States Patent
Meier et al.

(10) Patent No.: US 11,074,201 B2
(45) Date of Patent: Jul. 27, 2021

(54) APPARATUS WITH A SECURITY MECHANISM AND METHODS FOR OPERATING THE SAME

(71) Applicant: Micron Technology, Inc., Boise, ID (US)

(72) Inventors: Nathaniel J. Meier, Boise, ID (US); Diana C. Majerus, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/518,654

(22) Filed: Jul. 22, 2019

(65) Prior Publication Data
US 2021/0026786 A1   Jan. 28, 2021

(51) Int. Cl.
*G06F 12/14* (2006.01)
*G06F 13/16* (2006.01)
*G11C 16/26* (2006.01)
*G11C 29/52* (2006.01)
*G06F 11/07* (2006.01)

(52) U.S. Cl.
CPC ........ *G06F 12/1458* (2013.01); *G06F 11/076* (2013.01); *G06F 13/1689* (2013.01); *G11C 16/26* (2013.01); *G11C 29/52* (2013.01); *G06F 2201/81* (2013.01)

(58) Field of Classification Search
CPC .............. G06F 12/1458; G06F 11/076; G06F 13/1689; G06F 2201/81; G06F 12/1466; G06F 21/79; G11C 16/26; G11C 29/52
See application file for complete search history.

(56) References Cited

U.S. PATENT DOCUMENTS 9,384,152 B2 *   7/2016   Best ................. G06F 13/1689
9,858,208 B2 *   1/2018   Connolly ............ G06F 12/1466

* cited by examiner

*Primary Examiner* — Idriss N Alrobaye
*Assistant Examiner* — Richard B Franklin
(74) *Attorney, Agent, or Firm* — Perkins Coie LLP

(57) ABSTRACT

Methods, apparatuses and systems related to managing access to a memory device are described. A dynamic random access memory (DRAM) device may limit or restrict access. In some cases, a memory device may be operated in a secure mode following issuance of a sequence of commands or based on a certain timing (e.g., based on clock cycles or an oscillator). A mode register of the memory device may be used to enable or disable certain modes of operation, including secure modes of operation. In some examples, a memory device may operation in an idle state while in a secure mode, and it may ignore (e.g., take no action in response to) certain commands while in the idle mode. A device may ignore commands if it identifies a mismatch in clock cycles or oscillator frequency, including when moved from one system to another without prior authentication or orderly shutdown.

22 Claims, 7 Drawing Sheets

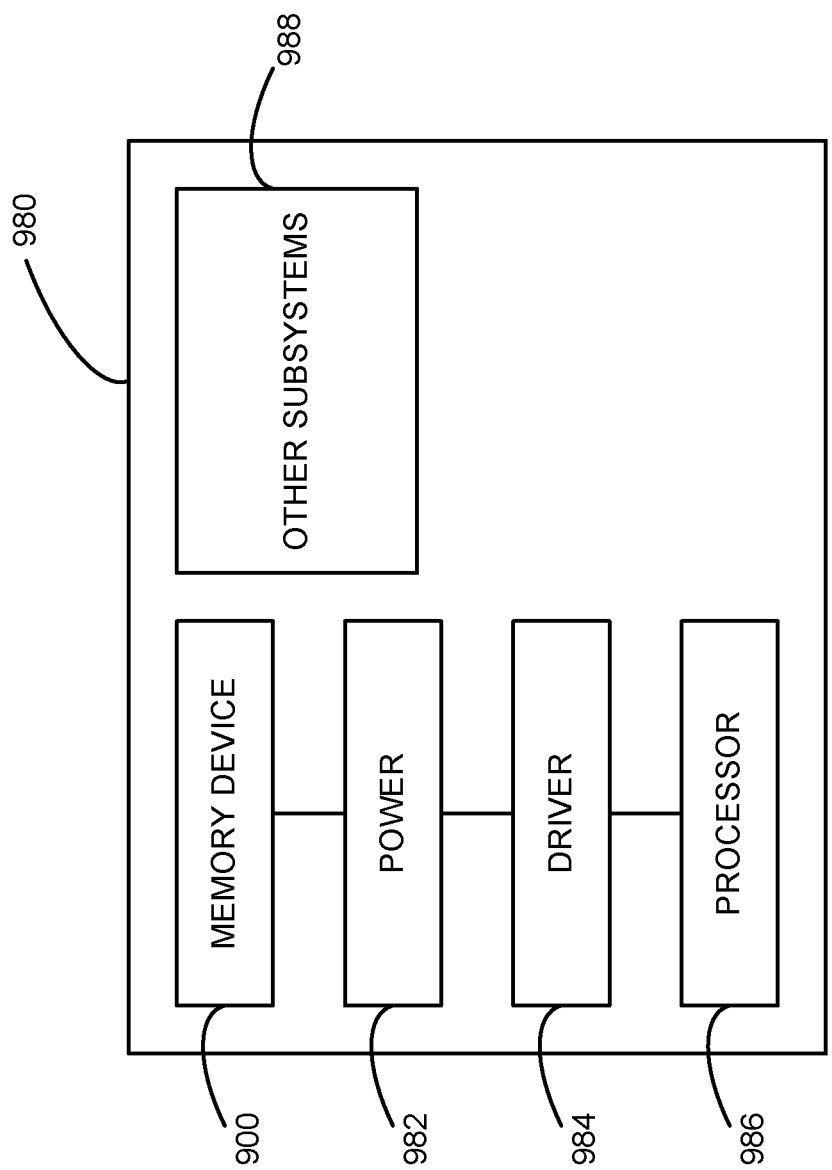

APPARATUS WITH A SECURITY MECHANISM AND METHODS FOR OPERATING THE SAME

TECHNICAL FIELD

The disclosed embodiments relate to devices, and, in particular, to semiconductor memory devices with a security mechanism and methods for operating the same.

BACKGROUND

An apparatus (e.g., a processor, a memory system, and/or other electronic apparatus) can include one or more semiconductor circuits configured to store and/or process information. For example, the apparatus can include a memory device, such as a volatile memory device, a non-volatile memory device, or a combination device. Memory devices, such as dynamic random-access memory (DRAM), can utilize electrical energy to store and access data.

BRIEF DESCRIPTION OF THE DRAWINGS

FIG. 9 is a schematic view of a system that includes an apparatus in accordance with an embodiment of the present technology.

DETAILED DESCRIPTION

As described in greater detail below, the technology disclosed herein relates to an apparatus, such as memory systems, systems with memory devices, related methods, etc., for authenticating an operating environment. The apparatus (e.g., a memory device and/or a system including the memory device) can include a security mechanism configured to periodically authenticate the operating environment, such as a combination of a controller and a memory.

Until recently, nefarious activities (e.g., hacking, snooping, etc.) occurred at levels above the hardware layers. For example, hackers attempt to gain unauthorized access to data stored in the address via software-based methods, such as by duplicating/stealing passwords, using software tools (e.g., computer worms), etc. However, recently-discovered activities utilize lower-level (e.g., at device/component levels) interactions to gain unauthorized access to the apparatus. For example, some snooping devices coupled to the apparatus may be configured to send commands and/or access information from memory devices when corresponding controllers are silent (e.g., in sleep states).

Figure 1:
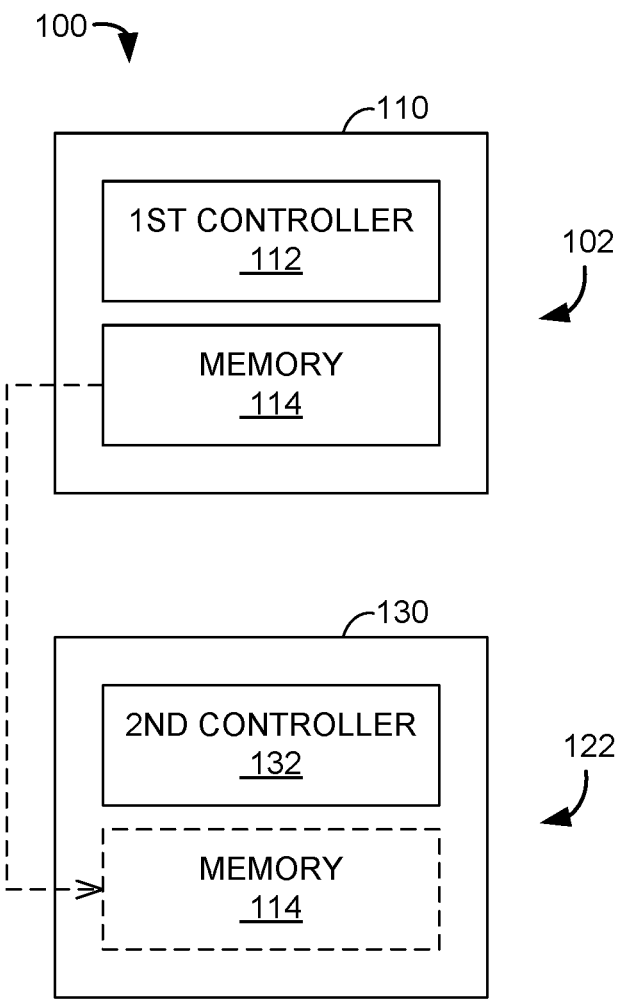
FIG. 1 is a schematic block diagram for a nefarious system including a conventional apparatus.

Another example of the lower-level nefarious interactions is illustrated using FIG. 1. FIG. 1 is a schematic block diagram for a nefarious system 100 ("system 100"). The system 100 can include a first module 102 and a second module 122 configured to introduce a new/nefarious controller during operation of a memory component. Accordingly, the system 100 includes a first controller 112 for the first module 102 and a second controller 132 for the second module 122. In some embodiments, the first module 102 can include a first circuit board and/or subsystem 110 ("first subsystem 110") that simulate a computing environment that includes other devices/circuits (e.g., power supply, accelerators, etc.). Similarly, the second module 122 can include a second circuit board and/or subsystem 130 ("second subsystem 130") that simulate the computing environment (i.e., via the same set of devices/circuits or a different set) while replacing the first controller 112 with the second controller 132.

The unauthorized access to memory 114 (e.g., dual inline memory module (DIMM)) occurs by initializing the memory 114 with the first controller 112 (i.e., a normal controller circuit) and subsequently using the second controller 132 (i.e., a nefarious controller circuit) to access/control the memory 114. As such, the memory 114 can be "hot swapped" by being connected to a different set of devices (e.g., from the first module 102 to the second module 122) during operation of the memory 114. The operating states of the memory 114 can be preserved during the swap, such as by maintaining power and/or avoiding reinitialization of the memory 114. For example, a module freeze spray and/or a switching circuit may be used to preserve the operating state of the memory 114 while swapping the DIMM across modules 102 and 122. Based on the swap, the conventional memory 114 may operate without detecting the change in the interfacing devices, and the second controller 132 may freely gain access to and control the memory 114.

In view of the ever-increasing commercial competitive pressures, along with growing consumer expectations and the desire to increase security in the marketplace, it is increasingly desirable that answers be found to these problems. Additionally, the need to reduce costs, improve efficiencies and performance, and meet competitive pressures adds an even greater concern to find answers to these problems.

Accordingly, the security mechanism can periodically authenticate the operating environment. In some embodiments, the apparatus can be configured to communicate an authentication command after a predetermined number of a targeted command, such as an activate command (ACT), a precharge command (PRE), etc. The security mechanism can include a counter-compare circuit that tracks the number of targeted command and compares the count to the predetermined number. When the authentication command is sent/received, the count can be reset. Without the authentication command, the apparatus can generate an error when the count matches and/or exceeds the predetermined number. Accordingly, when a nefarious device and/or system (e.g., the system 100 of FIG. 1) attempts to gain unauthorized access to the memory, the access can be limited by the predetermined number of commands. Further, subsequent interactions with the controller can result in an unanticipated error since the tracked counts at the memory and the controller would not match, such as due to the attempted/unauthorized access.

In some embodiments, the operating environment can be configured to communicate the authorization command after a predefined duration (e.g., a predetermined number of clock cycles). The security mechanism can include a timer-compare circuit that tracks time (via, e.g., counting clock cycles) and compares the duration to a predetermined limit. When the authentication command is sent/received, the memory security mechanism can reset the tracked duration. Without the authentication command, the apparatus can generate an error when the duration matches or exceeds the predetermined limit. Accordingly, when the nefarious device/system attempts to gain unauthorized access to the memory, the access can be limited by the predetermined duration. Further, subsequent interactions with the controller can result in unanticipated error since the tracked durations at the memory and the controller would not match, such as due to the module change.

Figure 2:
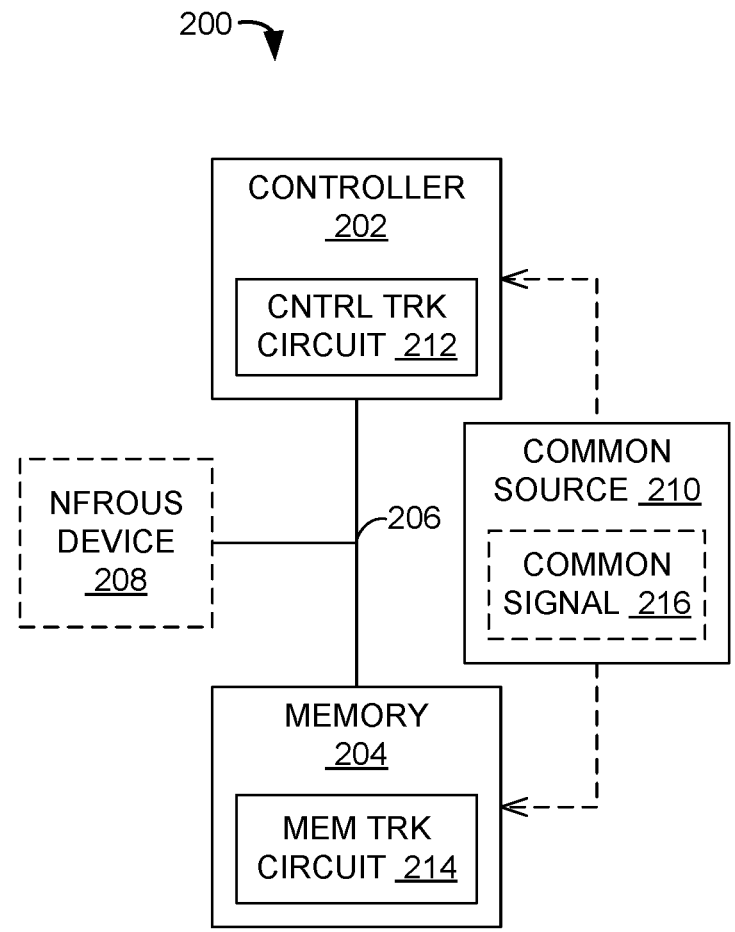
FIG. 2 is a schematic block diagram for a system-level apparatus in accordance with an embodiment of the present technology.

FIG. 2 is a schematic block diagram for a system-level apparatus 200 ("apparatus 200") in accordance with an embodiment of the present technology. The apparatus 200 can include a controller 202 (e.g., a processor and/or a system-on-chip (SOC) device) coupled to a memory 204 (e.g., DRAM) via a bus 206. As described above, the apparatus 200 may be unintentionally connected to a nefarious device 208 (e.g., a semiconductor chip) disguised as a functional device, such as another memory, processor, accelerator, etc. Since the nefarious device 208 would be advertised/disguised as a functional device, the nefarious device 208 may be coupled to the bus 206.

While the nefarious device 208 may or may not perform the advertised functions, it would be configured to perform unauthorized functions (e.g., spying/snooping/listening) with respect to other connected devices. For example, the nefarious device 208 may be configured to issue commands when the controller 202 is silent/sleeping during operation of the apparatus 200. For such duplicated commands, conventional memory devices (e.g., the memory 114 of FIG. 1) would execute the command issued by the nefarious device 208 since it cannot identify sources of the command. Additionally, conventional controllers (e.g., the first controller 112 of FIG. 1) would not be aware that an unauthorized interaction occurred between the nefarious device 208 and the memory 204.

In contrast to conventional devices, the apparatus 200 (e.g., the controller 202 and/or the memory 204) can include a security mechanism configured to prevent unauthorized access between hardware components. The security mechanism can include a controller tracking circuit 212 and/or a memory tracking circuit 214 configured to communicate authorization commands between the controller 202 and the memory 204 based on tracking an operational measure during operation of the apparatus 200.

In some embodiments, for example, the security mechanism can be configured to send/receive the authorization commands before a threshold number of targeted commands, such as ACT commands and/or PRE commands, are communicated between the devices. For example, the controller tracking circuit 212 can count the targeted commands sent by the controller 202 and trigger the controller 202 to send the authorization command before the tracked count reaches the threshold. Also, the memory tracking circuit 214 can count the targeted commands received by the memory 204. The memory 204 can pause normal/functional operations and/or communicate an error status to the controller 202 when the tracked count meets and/or exceeds the threshold, such as due to unauthorized commands from the nefarious device 208. While the unauthorized commands may not cause the tracked count to violate the threshold, such commands will cause the tracked counts at the memory 204 to be different from that of the controller 202. Accordingly, subsequent commands issued by the controller 202 can cause an unanticipated error status, which can cause the controller 202 to identify that unauthorized commands/access occurred by another device.

In some embodiments, for example, the security mechanism can be configured to send/receive the authorization commands within a threshold duration. For example, the controller tracking circuit 212 can count clock cycles and trigger the controller 202 to send the authorization command before the cycle count reaches the threshold. Also, the memory tracking circuit 214 can count clock cycles at the memory 204. The memory 204 can pause normal/function operations and/or communicate an error status to the controller 202 when the number of cycles meet and/or exceeds the threshold, such as due to unauthorized access of the memory 204 by the nefarious device 208 and/or the system 100 of FIG. 1. In some embodiments, the controller 202 can identify that unauthorized commands/access occurred by another device based on receiving the errors status from the memory 204. In one or more embodiments, the clock cycles at the controller 202 and the memory 204 are generated by synchronized oscillators within the respective circuits. In other embodiments, the clock cycles can be generated by the controller 202 or the memory 204 and communicated to the other device. In other embodiments, the clock cycles can be based on a common signal 216 generated by a common source 210 and synchronously communicated to the controller 202 and the memory 204.

Figure 3:
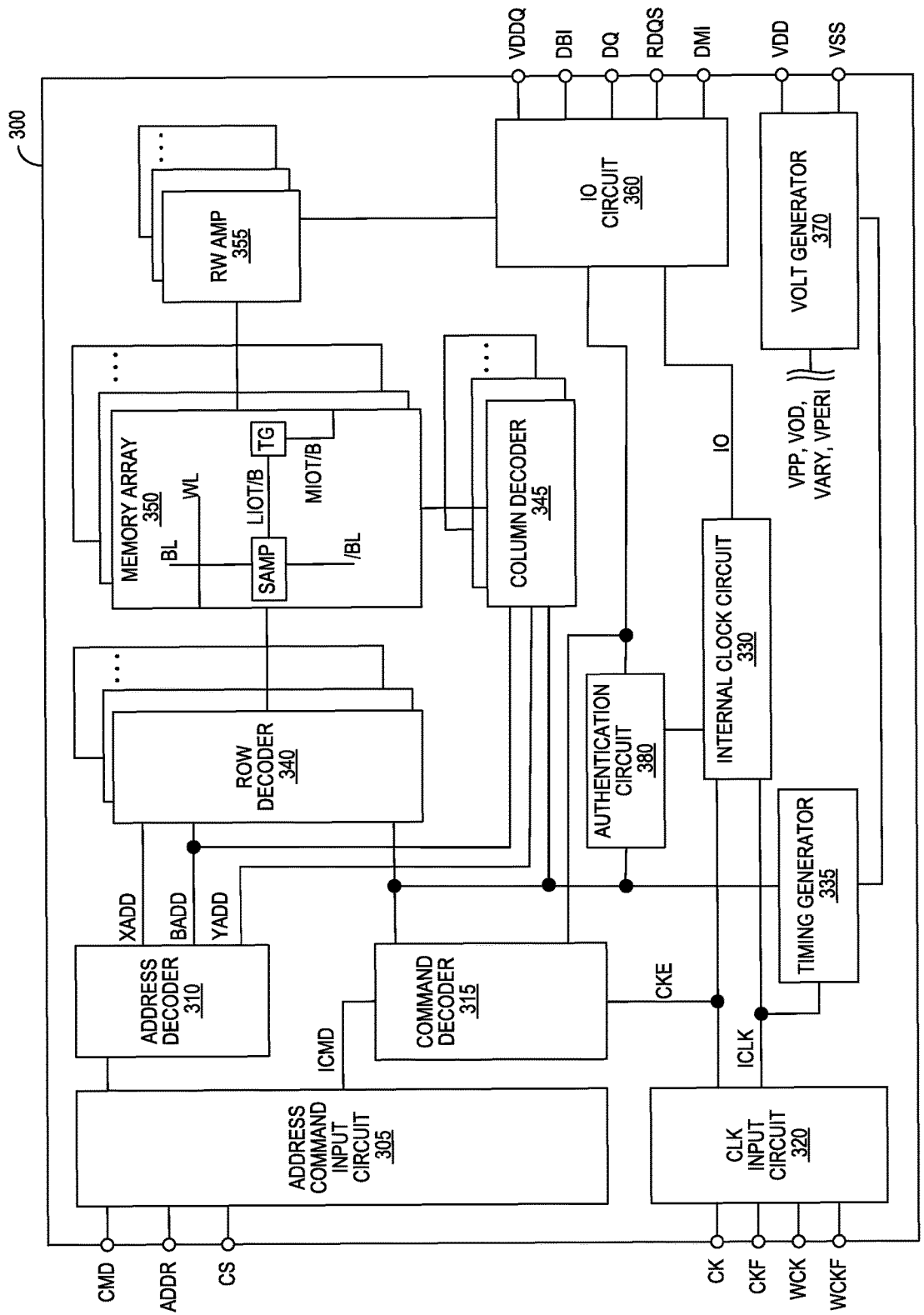
FIG. 3 is a block diagram of an apparatus in accordance with an embodiment of the present technology.

FIG. 3 is a block diagram of an apparatus 300 (e.g., a semiconductor die assembly, including a three-dimensional integration (3DI) device or a die-stacked package) in accordance with an embodiment of the present technology. For example, the apparatus 300 can include a DRAM or a portion thereof that includes one or more dies/chips.

The apparatus 300 may include an array of memory cells, such as memory array 350. The memory array 350 may include a plurality of banks (e.g., banks 0-15), and each bank may include a plurality of word lines (WL), a plurality of bit lines (BL), and a plurality of memory cells arranged at intersections of the word lines and the bit lines. Memory cells can include any one of a number of different memory media types, including capacitive, magnetoresistive, ferroelectric, phase change, or the like. The selection of a word line WL may be performed by a row decoder 340, and the selection of a bit line BL may be performed by a column decoder 345. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches. The memory array 350 may also include plate lines and corresponding circuitry for managing their operation.

The apparatus 300 may employ a plurality of external terminals that include command and address terminals coupled to a command bus and an address bus to receive command signals (CMD) and address signals (ADDR), respectively. The apparatus 300 may further include a chip select terminal to receive a chip select signal (CS), clock terminals to receive clock signals CK and CKF, data clock terminals to receive data clock signals WCK and WCKF, data terminals DQ, RDQS, DBI, and DMI, power supply terminals VDD, VSS, and VDDQ.

The command terminals and address terminals may be supplied with an address signal and a bank address signal (not shown in FIG. 3) from outside. The address signal and the bank address signal supplied to the address terminals can be transferred, via a command/address input circuit 305, to an address decoder 310. The address decoder 310 can receive the address signals and supply a decoded row address signal (XADD) to the row decoder 340, and a decoded column address signal (YADD) to the column decoder 345. The address decoder 310 can also receive the bank address signal and supply the bank address signal to both the row decoder 340 and the column decoder 345.

The command and address terminals may be supplied with command signals (CMD), address signals (ADDR), and chip select signals (CS), from a memory controller and/or a nefarious chipset. The command signals may represent various memory commands from the memory controller (e.g., including access commands, which can include read commands and write commands). The chip select signal may be used to select the apparatus 300 to respond to commands and addresses provided to the command and address terminals. When an active chip select signal is provided to the apparatus 300, the commands and addresses can be decoded and memory operations can be performed. The command signals may be provided as internal command signals ICMD to a command decoder 315 via the command/address input circuit 305. The command decoder 315 may include circuits to decode the internal command signals ICMD to generate various internal signals and commands for performing memory operations, for example, a row command signal to select a word line and a column command signal to select a bit line. The command decoder 315 may further include one or more registers for tracking various counts or values (e.g., counts of refresh commands received by the apparatus 300 or self-refresh operations performed by the apparatus 300).

Read data can be read from memory cells in the memory array 350 designated by row address (e.g., address provided with an active command) and column address (e.g., address provided with the read). The read command may be received by the command decoder 315, which can provide internal commands to input/output circuit 360 so that read data can be output from the data terminals DQ, RDQS, DBI, and DMI via read/write amplifiers 355 and the input/output circuit 360 according to the RDQS clock signals. The read data may be provided at a time defined by read latency information RL that can be programmed in the apparatus 300, for example, in a mode register (not shown in FIG. 3). The read latency information RL can be defined in terms of clock cycles of the CK clock signal. For example, the read latency information RL can be a number of clock cycles of the CK signal after the read command is received by the apparatus 300 when the associated read data is provided.

Write data can be supplied to the data terminals DQ, DBI, and DMI according to the WCK and WCKF clock signals. The write command may be received by the command decoder 315, which can provide internal commands to the input/output circuit 360 so that the write data can be received by data receivers in the input/output circuit 360, and supplied via the input/output circuit 360 and the read/write amplifiers 355 to the memory array 350. The write data may be written in the memory cell designated by the row address and the column address. The write data may be provided to the data terminals at a time that is defined by write latency WL information. The write latency WL information can be programmed in the apparatus 300, for example, in the mode register. The write latency WL information can be defined in terms of clock cycles of the CK clock signal. For example, the write latency information WL can be a number of clock cycles of the CK signal after the write command is received by the apparatus 300 when the associated write data is received.

The power supply terminals may be supplied with power supply potentials VDD and VSS. These power supply potentials VDD and VSS can be supplied to an internal voltage generator circuit 370. The internal voltage generator circuit 370 can generate various internal potentials VPP, VOD, VARY, VPERI, and the like based on the power supply potentials VDD and VSS. The internal potential VPP can be used in the row decoder 340, the internal potentials VOD and VARY can be used in the sense amplifiers included in the memory array 350, and the internal potential VPERI can be used in many other circuit blocks.

The power supply terminal may also be supplied with power supply potential VDDQ. The power supply potential VDDQ can be supplied to the input/output circuit 360 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 360 so that power supply noise generated by the input/output circuit 360 does not propagate to the other circuit blocks.

The clock terminals and data clock terminals may be supplied with external clock signals and complementary external clock signals. The external clock signals CK, CKF, WCK, WCKF can be supplied to a clock input circuit 320. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 320 can receive the external clock signals. For example, when enabled by a clock/enable signal from the command decoder 315, an input buffer can receive the clock/enable signals. The clock input circuit 320 can receive the external clock signals to generate internal clock signals ICLK. The internal clock signals ICLK can be supplied to an internal clock circuit 330. The internal clock circuit 330 can provide various phase and frequency controlled internal clock signals based on the received internal clock signals ICLK and a clock enable (not shown in FIG. 3) from the command/address input circuit 305. For example, the internal clock circuit 330 can include a clock path (not shown in FIG. 3) that receives the internal clock signal ICLK and provides various clock signals to the command decoder 315. The internal clock circuit 330 can further provide input/output (IO) clock signals. The IO clock signals can be supplied to the input/output circuit 360 and can be used as timing signals for determining output timing of read data and/or input timing of write data. The IO clock signals can be provided at multiple clock frequencies so that data can be output from and input to the apparatus 300 at different data rates. A higher clock frequency may be desirable when high memory speed is desired. A lower clock frequency may be desirable when lower power consumption is desired. The internal clock signals ICLK can also be supplied to a timing generator 335 and thus various internal clock signals can be generated.

The apparatus 300 can be connected to any one of a number of electronic devices capable of utilizing memory for the temporary or persistent storage of information, or a component thereof. For example, a host device of apparatus 300 may be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device may be a networking device (e.g., a switch, a router, etc.) or a recorder of digital images, audio and/or video, a vehicle, an appliance, a toy, or any one of a number of other products. In one embodiment, the host device may be connected directly to apparatus 300; although in other embodiments, the host device may be indirectly connected to memory device (e.g., over a networked connection or through intermediary devices).

The apparatus 300 can include an authentication circuit 380 configured to authenticate the operating environment of the apparatus 300. The authentication circuit 380 can be configured to authenticate devices (e.g., processor, SOC, etc.) interacting with the apparatus 300 and/or messages, data, etc. exchanged between the apparatus and the other devices. In some embodiments, the authentication circuit 380 can identify authentication commands received via the command/address input circuit 305 and/or the command decoder 315. The authentication circuit 380 can reset and begin counting/tracking targeted operating commands and/or duration after receiving and verifying the authentication command. The authentication circuit 380 can compare the tracked count/duration with a predetermined threshold. As described above, the authentication circuit 380 can reset the count/duration upon receiving a subsequent authentication command. When the count/duration matches or exceeds the predetermined threshold, the authentication circuit 380 can output a signal for reporting the erroneous status and/or for stopping operation of the apparatus 300. Details regarding the authentication process are described below.

Figure 4:
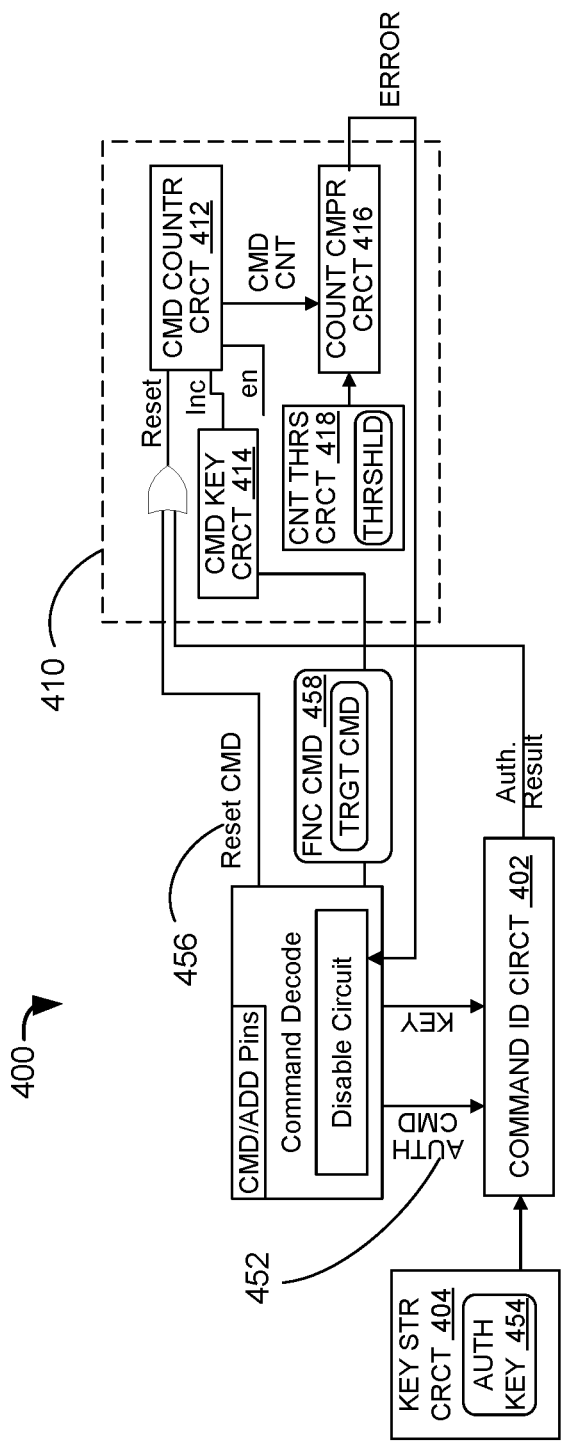
FIG. 4 is an example schematic block diagram of an authentication circuit in accordance with an embodiment of the present technology.

FIG. 4 is an example schematic block diagram of an authentication circuit 400 (e.g., an embodiment of the authentication circuit 380 of FIG. 3) in accordance with an embodiment of the present technology. The authentication circuit 400 can be coupled to the command decoder 315. Accordingly, the authentication circuit 400 can receive various outputs/commands from the command decoder 315. For example, the authentication circuit 400 can receive an authentication command 452, an authentication key 454, a reset command 456, a functional command 458, or a combination thereof. The authentication command 452 can be a controller-issued command that is configured to ensure proper operation of the apparatus 300 of FIG. 3 in relation to the operating environment. The authentication key 454 can be a set of bit values stored (e.g., in a key storage circuit 404, such as a set of fuses and/or metal connections) in the apparatus 300 that match the authentication command 452. Some examples of the authentication key 454 can include a series of bits, a hashed value, a hash function, checksum data, cyclic redundancy check data, etc. Accordingly, the authentication circuit 400 can include a command identification circuit 402 configured to identify/recognize the authentication command 452. For example, the command identification circuit 402 can compare the received command to the authentication key 454 and generate an authentication status 460 when the received command matches the authentication key 454.

In some embodiments, the authentication circuit 400 can include a tracking circuit 410 for tracking/counting occurrences of targeted commands during operation of the apparatus 300. The tracking circuit 410 can receive and process the reset command 456 and/or the functional command 458 from the command decoder 315. The reset command 456 can be a command configured to reset one or more states. In some embodiments, the reset command 456 can be configured to accompany the authentication command 452 for resetting one or more counts associated with the authentication process. The functional commands 458 can include commands for the apparatus 300 to perform/implement specific actions. Some examples of the functional commands 458 can include an activate command (ACT), a precharge command (PRE), and/or a different command associated with reading and/or writing operations.

In some embodiments, the tracking circuit 410 can include a command counter 412, a command key circuit 414, a count comparison circuit 416, a count threshold circuit 418, or a combination thereof for tracking/counting occurrences of the targeted commands. The command counter 412 can be configured to identify occurrences of the targeted command, such as by comparing the functional commands 458 to the targeted command stored in the command key circuit 414. In some embodiments, the targeted command can be predetermined and stored in the command key circuit 414, via, e.g., fuse and/or metal settings. In other embodiments, the targeted command can be dynamically selected (e.g., during operation of the apparatus 300, such as at regular intervals or during device initialization) according to a predetermined interaction with the controller. The command counter 412 can include a counting circuit that tracks a command count. The command counter 412 can increment the command count each time the received functional command matches the targeted command.

The count comparison circuit 416 can be configured to compare the tracked command count to an execution threshold stored in the count threshold circuit 418. The execution threshold can include a predetermined limit for executing/implementing the targeted command. In some embodiments, the count threshold circuit 418 can include fuse and/or metal settings that represent the predetermined limit. In other embodiments, the count threshold circuit 418 can dynamically receive (via, e.g., a restricted protocol during operation of the apparatus 300) and store the predetermined limit. The count comparison circuit 416 can be configured to generate an error output (by, e.g., transitioning a bit value) when the command count matches or exceeds the execution threshold. When the error output is generated, the apparatus 300 can be configured (via, e.g., a disable/reporting logic) to report the error status to other external devices and/or ignore the functional commands 458 until a predetermined sequence of operations and/or commands are received. The error status from the count comparison circuit 416 can be fed back to the disable logic, which can be included in the command decoder 315 and/or other portions/locations of the apparatus 300, such as the input/output circuit 360 of FIG. 3.

As an illustrative example of the overall operation, a computing system that includes a controller and the apparatus 300 can be configured to issue (via, e.g., the controller) the authentication command 452 immediately following or before issuing a predetermined number of the targeted commands. In some embodiments, the targeted command and the predetermined number can be pre-set (e.g., during assembly and/or before deployment) and/or dynamically communicated (e.g., during booting sequence and/or system initialization) via a restricted encoding or protocol. As such, the predetermined number and/or the targeted commands can be accessible only for the controller and the apparatus 300 and unknown to other devices in the computing system.

For the example illustrated in the timing diagram described below, the computing system can be configured to issue the authentication command immediately after or prior to a third PRE command. Accordingly, the apparatus 300 can be configured to implement the commands as long as the authentication command is received prior to or immediately after the third PRE command. As such, the apparatus 300 can limit any unauthorized intrusions, such as nefarious actions executed via the nefarious device 208 of FIG. 2 and/or the system 100 of FIG. 1, based on the limit of three PRE commands. Since the nefarious device 108 and the second controller 232 of FIG. 2 would not be aware of the targeted command and/or the execution threshold, the unauthorized intrusions will not be accompanied by timely issuance of the authorization command. Inevitably, the unauthorized intrusions can violate the execution threshold and the apparatus 300 can cease normal operations, thereby protecting against further unauthorized intrusions. Even if the unauthorized intrusions stop prior to reaching the execution threshold, subsequent authorized access by the controller will cause an unanticipated error output. The unanticipated error output can occur since the command count at the apparatus 300 will be higher than the corresponding value at the controller due to the unauthorized intrusions. Based on the unanticipated error output, the controller may detect that unauthorized intrusions are occurring in the computing system and that nefarious devices may be present therein.

Figure 5:
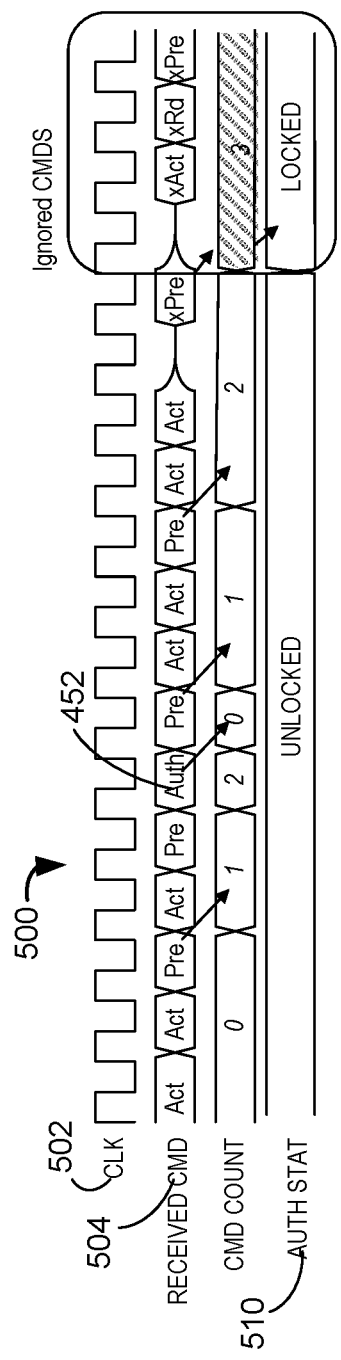
FIG. 5 is a timing diagram illustrating an operation of the authentication circuit shown in FIG. 4 in accordance with an embodiment of the present technology.

FIG. 5 is a timing diagram illustrating an operation 500 of the authentication circuit 400 shown in FIG. 4 in accordance with an embodiment of the present technology. As described above, the operation 500 is based on an illustrative example of using the PRE command as the targeted command and three as the execution threshold. However, it is understood that the operation 500 can be based on targeting a different command, such as the ACT command, and/or based on using a different number for the execution threshold.

In some embodiments, the authentication circuit 400 of FIG. 4 can receive a clock signal 502 from the internal clock circuit 330 of FIG. 3. The authentication circuit 400 can use the clock signal 502 for timing various operations. For example, the clock signal 502 can correspond to received commands 504 and associated status indications. The received commands 504 can include the authentication command 452 and/or the functional commands 458 received by the authentication circuit 400. As described above, the authentication circuit 400 can reset and begin incrementing the command count following the authentication command. The authentication circuit 400 can control an authentication status 510 based on the command count.

As illustrated in FIG. 5, the command count can be at zero, such as following a system initialization and/or an authentication command. When the targeted command is set to PRE command, the authentication circuit 400 can increment the command count when the functional command 458 is identified as the PRE command. For normal operations, the received command 504 can include the authentication command 452 before or immediately after the command count reaches the execution threshold. Accordingly, the authentication status 510 can remain unlocked during the beginning portion of FIG. 5.

Latter portions of FIG. 5 illustrate unauthorized access, such as by the nefarious device 208 of FIG. 2 and/or the system 100 of FIG. 1 while the controller is in a sleep mode. The unauthorized access can be represented by 'xPre,' 'xAct,' and 'xRd' within the received commands 504. Since the device responsible for the unauthorized access would not be aware of the targeted command, the execution threshold, and/or the command count, the unauthorized access would not be accompanied by the authentication command 452. As such, the unauthorized access can include a targeted command that will cause the command count to match or exceed the execution threshold. As shown in FIG. 5, the command count can reach four based on the unauthorized PRE command. When the command count matches or exceeds the execution threshold, the authentication circuit 400 can generate the authentication status 510 to represent a locked state. Accordingly, the apparatus 300 can ignore the received commands 504 when the authentication status 510 corresponds to the locked state. The apparatus can remain in the locked state until a specific sequence of actions is taken and/or commands are received according to a predetermined unlocking protocol.

Figure 6:
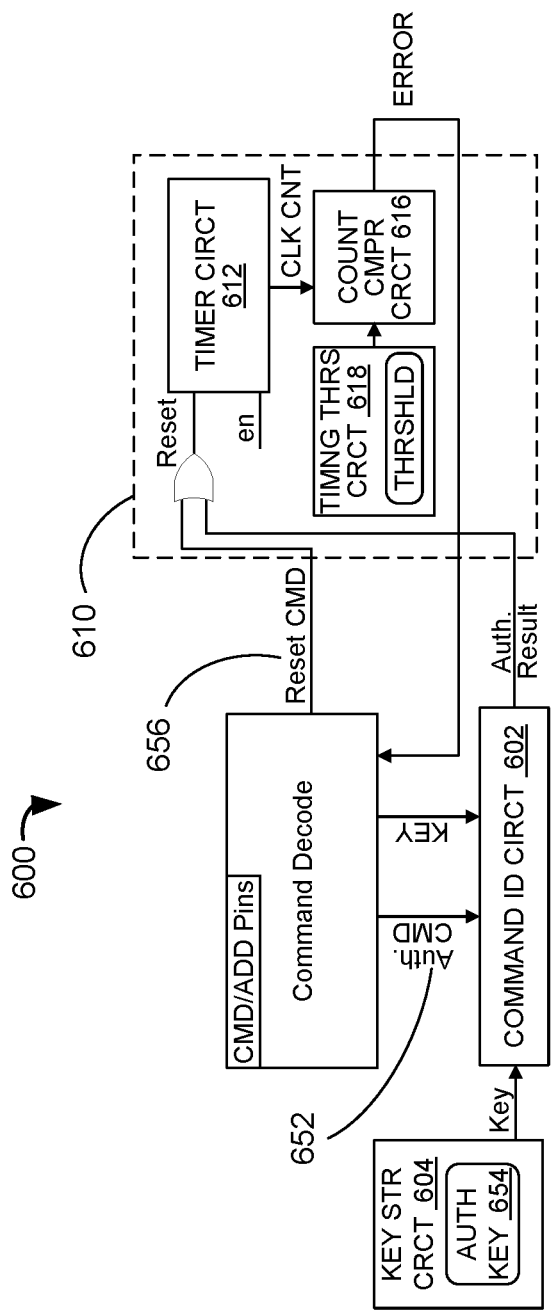
FIG. 6 is an example schematic block diagram of an authentication circuit in accordance with an embodiment of the present technology.

FIG. 6 is an example schematic block diagram of an authentication circuit 600 (e.g., an embodiment of the authentication circuit 380 of FIG. 3) in accordance with an embodiment of the present technology. The authentication circuit 600 can be coupled to the command decoder 315. Accordingly, the authentication circuit 600 can receive various outputs/commands from the command decoder 315. For example, the authentication circuit 600 can receive an authentication command 652, an authentication key 654, a reset command 656, or a combination thereof. The authentication command 652 can be a controller-issued command that is configured to ensure proper operation of the apparatus 300 of FIG. 3 in relation to the operating environment. The authentication key 654 can be a set of bit values stored (e.g., in a key storage circuit 604, such as a set of fuses and/or metal connections) in the apparatus 300 that match the authentication command 652. Some examples of the authentication key 654 can include a series of bits, a hashed value, a hash function, checksum data, cyclic redundancy check data, etc. Accordingly, the authentication circuit 600 can include a command identification circuit 602 configured to identify/recognize the authentication command 652. For example, the command identification circuit 602 can compare the received command to the authentication key 654 and generate an authentication status 660 when the received command matches the authentication key 654.

In some embodiments, the authentication circuit 600 can include a tracking circuit 610 for tracking time following the reset command 656 during operation of the apparatus 300. The tracking circuit 610 can use a clock signal generated by an internal oscillator and/or the internal clock circuit 330 of FIG. 3 to track the time. For example, the tracking circuit 610 can include a counting circuit that increments according to the clock signal and can be reset based on the reset command 656 and/or the authentication command 652. The reset command 656 can be a command configured to reset one or more states. In some embodiments, the reset command 656 can be configured to accompany the authentication command 652 for resetting one or more counts associated with the authentication process.

In some embodiments, the tracking circuit 610 can include a clock counter 612, a count comparison circuit 616, a count threshold circuit 618, or a combination thereof for tracking/counting the clock signals. The clock counter 612 can be configured to track a duration, such as by incrementing according to the clock signal. The clock signal can be synchronized and similarly tracked at the controller. The clock counter 612 can increment a command count according to the clock signal, such as for each period, rising/falling edge, etc. As described above, the clock counter 612 can reset the clock count based on the authentication command 652 and/or the reset command 656.

The count comparison circuit 616 can be configured to compare the tracked clock count to a duration threshold stored in the count threshold circuit 618. The duration threshold can include a predetermined time limit for operating without receiving the authentication command 652. In some embodiments, the count threshold circuit 618 can include fuse and/or metal settings that represent the predetermined limit. In other embodiments, the count threshold circuit 618 can dynamically receive (via, e.g., a restricted protocol during operation of the apparatus 300) and store the predetermined limit. The count comparison circuit 616 can be configured to generate an error output (by, e.g., transitioning a bit value) when the clock count matches or exceeds the duration threshold. When the error output is generated, the apparatus 300 can be configured (via, e.g., a disable/reporting logic) to report the error status to other external devices and/or ignore subsequently received commands until a predetermined unlocking sequence of operations and/or commands are received. The error status from the count comparison circuit 616 can be fed back to the disable logic, which can be included in the command decoder 315 and/or other portions/locations of the apparatus 300, such as the input/output circuit 360 of FIG. 3.

As an illustrative example of the overall operation, a computing system that includes a controller and the apparatus 300 can be configured to issue (via, e.g., the controller) the authentication command 652 immediately following or before the clock count reaches the duration threshold. An example controller can be configured to track the clock count via a synchronized clock signal and issue the authentication command 652 immediately following or before the clock count reaches the duration threshold. In some embodiments, the duration threshold can be pre-set (e.g., during assembly and/or before deployment) and/or dynamically communicated (e.g., during booting sequence and/or system initialization) via a restricted encoding or protocol. As such, the synchronized clock and/or the duration threshold can be accessible only for the controller and the apparatus 300 and unknown to other devices in the computing system.

For the example illustrated in the timing diagram described below, the computing system can be configured to issue the authentication command immediately after or prior to a third clock cycle. Accordingly, the apparatus 300 can be configured to operate as long as the authentication command is received prior to or immediately after the third clock cycle. As such, the apparatus 300 can limit any unauthorized intrusions, such as nefarious actions executed via the nefarious device 208 of FIG. 2 and/or the system 100 of FIG. 1, based on the limit of three clock cycles. Since the nefarious device 108 and the second controller 232 of FIG. 2 would not be aware of the synchronized clock signal and/or the duration threshold, the unauthorized intrusions will not be accompanied by timely issuance of the authorization command. Inevitably, the unauthorized intrusions can violate the execution threshold and the apparatus 300 can cease normal operations, thereby protecting against further unauthorized intrusions.

Also for illustrative purposes, the authentication circuit 600 is shown separately from the authentication circuit 400 of FIG. 4. However, in some embodiments, the apparatus 300 can include the authentication circuit 400 and the authentication circuit 600. For example, the outputs from the authentication circuits 400 and 600 can be fed into an OR gate. Accordingly, the apparatus 300 can operate based on the authentication command arriving before the command count matches/exceeds the execution threshold and before the clock count matches/exceeds the duration threshold.

Figure 7:
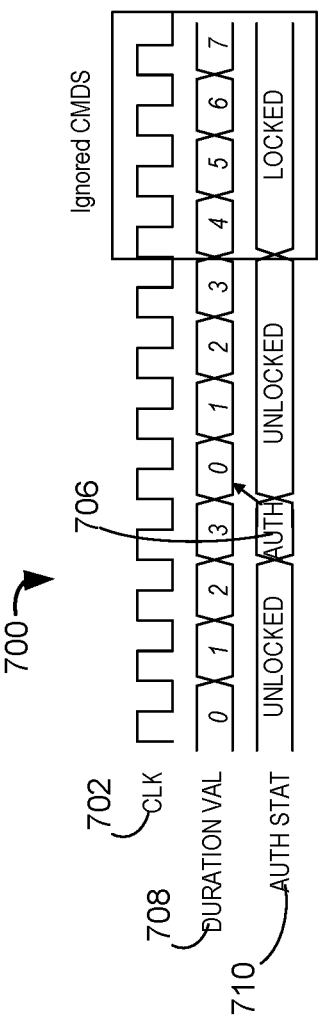
FIG. 7 is a timing diagram illustrating an operation of the authentication circuit shown in FIG. 6 in accordance with an embodiment of the present technology.

FIG. 7 is a timing diagram illustrating an operation 700 of the authentication circuit 600 shown in FIG. 6 in accordance with an embodiment of the present technology. As described above, the operation 700 is based on an illustrative example of the duration threshold of three clock cycles. However, it is understood the operation 700 can be based on a different duration threshold.

In some embodiments, the authentication circuit 600 of FIG. 6 can utilize a clock signal 702 that is synchronized with a signal at a controller coupled to the apparatus 300 of FIG. 3. The clock signal 702 can be supplied by the internal clock circuit 330 of FIG. 3 and/or an oscillator within the authentication circuit 600. The clock signal 702 can further correspond to various other operations. For example, the clock signal 702 can correspond to received commands and associated status indications. The received commands can include the authentication command 652 of FIG. 6 and/or the functional commands received by the apparatus 300. As described above, the authentication circuit 600 can reset and begin incrementing the clock count following the authentication command. The authentication circuit 600 can control an authentication status 710 based on the command count.

As illustrated in FIG. 7, the command count can be at zero, such as following a system initialization and/or an authentication command (not shown). The authentication circuit 600 can increment the clock count based on the clock signal 702, such as for each clock period. During normal operation, as illustrated in a first portion of FIG. 7, the authentication circuit 600 can expect and/or receive the authentication command 652 before the clock count matches/exceeds the duration threshold. Accordingly, the authentication status 710 can remain unlocked.

Latter portions of FIG. 7 illustrate unauthorized access, such as by the nefarious device 208 of FIG. 2 and/or the system 100 of FIG. 1. Since the device responsible for the unauthorized access would not be aware of the synchronized clock, the clock count, and/or the duration threshold, the unauthorized access would not be accompanied by a timely issued authentication command 652. As such, the unauthorized access can cause the clock count to match or exceed the duration threshold. As shown in FIG. 7, the clock count can reach/exceed four due to the absence of the authentication command 652. When the clock count matches or exceeds the duration threshold, the authentication circuit 600 can generate the authentication status 710 to represent a locked state. Accordingly, the apparatus 300 can ignore subsequent commands when the authentication status 710 corresponds to the locked state. The apparatus can remain in the locked state until a specific sequence of actions is taken and/or commands are received according to a predetermined unlocking protocol.

Figure 8:
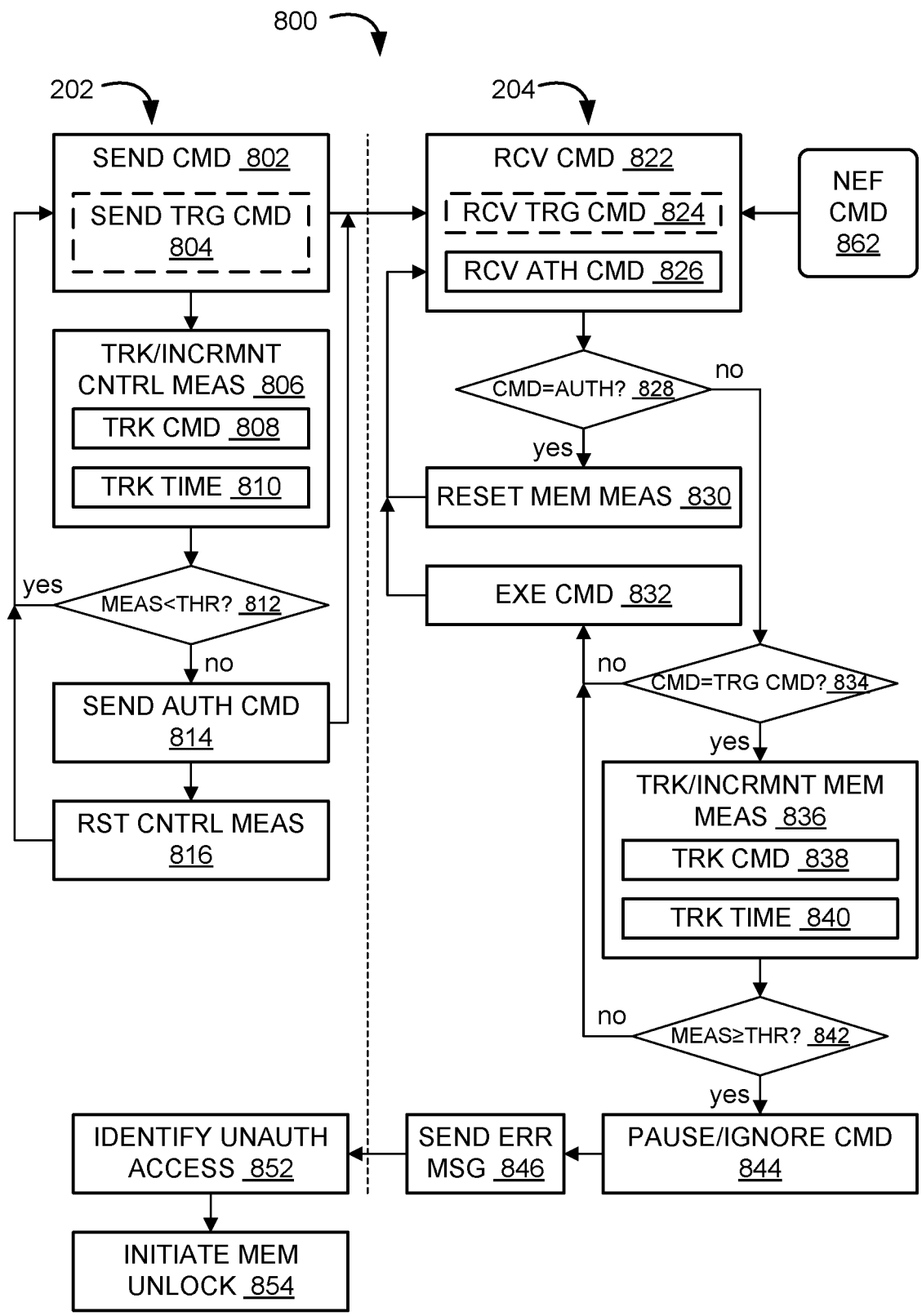
FIG. 8 is a flow diagram illustrating an example method of operating an apparatus in accordance with an embodiment of the present technology.

FIG. 8 is a flow diagram illustrating an example method 800 of operating an apparatus (e.g., the apparatus 200 of FIG. 2 and/or apparatus 300 of FIG. 3) in accordance with an embodiment of the present technology. For example, the method 800 can be for operating the controller 202 of FIG. 2, the memory 204 of FIG. 2, the apparatus 300 (e.g., a memory device, such as a DRAM), authentication circuits therein, or a combination thereof as described above using example timing diagrams (e.g., the timing diagrams of FIG. 5 and/or FIG. 7). The method 800 can be for periodically authenticating the operating environment of the corresponding apparatus.

At blocks 802 and 822, the controller 202 and the memory 204 can communicate memory-related commands (e.g., the authentication command 452, the reset command 456, the functional commands 458, or a combination thereof illustrated in FIG. 4) between devices, such as the controller 202 and the memory 204. At block 802, the controller 202 can send the memory-related commands for processing data, such as for reading data from the memory 204 and/or writing data to the memory 204. At block 822, the memory 204 can receive the corresponding commands. In other words, the memory 204 can receive the commands from the controller 202.

Regarding operations of the controller 202, at block 806, the controller 202 can track a control operational measure. The controller 202 can track the control operational measure based on incrementing a counter according to a condition. For example, as illustrated at block 808, the controller 202 can track a targeted command based on incrementing the counter whenever a targeted command is issued. The controller 202 (via, e.g., the controller tracking circuit 212 of FIG. 2) can identify the targeted command and increment the counter similarly as the authentication circuit 400 of FIG. 4 described above. Also, as illustrated at block 810, the controller 202 can track time based on incrementing the counter based on clock cycles. The controller 202 (via, e.g., the controller tracking circuit 212) can increment the counter similarly as the authentication circuit 600 of FIG. 6 described above. In some embodiments, the clock signal can be internally generated at the controller 202 by an oscillator that is synchronized with that of the memory 204. In other embodiments, the clock signal can be generated based on the common source 210 and the common signal 216 illustrated in FIG. 2.

At decision block 812, the controller 202 can determine whether the tracked measure (e.g., the counter value) is below a predetermined threshold. In some embodiments, the predetermined threshold can represent a maximum number of targeted commands and/or a maximum duration relative to a last-issued authentication command. While the tracked measure is below the threshold, the controller 202 can continue normal operations as illustrated by the feedback loop to 802. When the tracked measure matches and/or exceeds the threshold, the controller 202 can send the authentication command (e.g., the authentication command 452 of FIG. 4 and/or the authentication command 652 of FIG. 6) to the memory 204 as illustrated at block 814. At the memory 204, the authentication command can be received as one of the memory-related commands as illustrated at block 822. Subsequent to sending the authentication command, the controller 202 can reset the control measure (e.g., the counter value) as illustrated at block 816 and continue operations as illustrated by the feedback loop to block 802.

Regarding operations of the memory 204 (e.g., the memory tracking circuit 214 of FIG. 2, the authentication circuit 380 of FIG. 3, etc.), the memory 204 can interact with the controller 202 for normal/functional operations such as for writing and/or reading data. As described above, at block 822, the memory 204 can receive memory-related commands from the controller 202 as part of normal operation. As illustrated at block 824, the memory 204 can receive targeted commands within the functional commands 458. Also, as illustrated at block 826, the memory 204 can receive the authentication command.

The memory 204 can analyze the received commands to identify specific commands, such as the targeted commands and/or the authentication commands as described above. For example, at block 828, the memory 204 can determine whether the received command includes the authentication command. In some embodiments, the command identification circuit can compare the received commands to the authentication key to identify the authentication command as described above. When the memory 204 receives the authentication command, the authentication circuit can reset the counter tracking the memory operational measure as illustrated at block 830. Subsequently, the memory can continue normal/functional operations as illustrated by the feedback loop to block 822.

When the received command is not the authentication command, the memory 204 can determine whether the received command includes the targeted command as illustrated at block 834. When the received command is not the targeted command, the memory 204 can execute/implement the command as illustrated at block 832 and continue normal/functional operations. When the received command is the targeted command, the memory 204 can track a memory operational measure. The memory 204 can track the memory operational measure similarly as described above for block 806. For example, as illustrated at block 838, the memory 204 (via, e.g., the authentication circuit 400) can track the targeted command based on incrementing the counter whenever a targeted command is received. Also, as illustrated at block 840, the memory 204 (via, e.g., the authentication circuit 600) can track time based on incrementing the counter based on clock cycles generated by an internal oscillator and/or an external signal.

At block 842, the memory 204 can determine whether the memory operational measure matches or exceeds a threshold (e.g., a limit for targeted commands and/or a time limit). In other words, the memory 204 determines that a quantity of the received commands exceeds a threshold number of commands. When the memory operational measure is below the threshold, the memory 204 can execute/implement the command as illustrated at block 832 and continue the normal/functional operations. When the memory operational measure matches and/or exceeds the threshold, the memory 204 (via, e.g., the disable circuit) can pause the normal/functional operations and/or ignore the received commands as illustrated at block 844. The memory 204 can operate in a different mode based at least in part on determining that the quantity of received commands exceeds the threshold. In some embodiments, for example, operating in the different mode includes taking no action in response to one or more commands received beyond the threshold number. In some embodiments, as illustrated at block 846, the memory 204 can send an error message to the controller 202 based on the memory operational measure matching and/or exceeding the threshold.

In response, as illustrated at block 852, the controller 202 can identify unauthorized access based on receiving the error message. In some embodiments, the controller 202 can initiate operations to identify the nefarious device/actor, mitigate further unauthorized access, and/or report the status to a remote entity/device (representative of, e.g., manufacturer of the apparatus). In some embodiments, after the nefarious devices/actors have been resolved, the controller 202 can initiate a memory unlock process for continuing the normal/functional operations at the memory 204 as illustrated at block 854.

In some embodiments, the method 800 can include dynamically setting the targeted command, the threshold, or a combination thereof during operation of the apparatus 200 and/or 300. For example, the method 800 can include receiving and storing a targeted command (e.g., a precharge command, an activate command, a read command, and/or a write command), resetting the count in response to receiving the authentication command, comparing the received commands following the authentication command to the targeted command, and incrementing the count when one of the received commands matches the targeted command. Also, the method 800 can include comparing the count to the threshold, and generating an error status when the command count exceeds the threshold, wherein the error status represents an unauthorized access to the apparatus 200 and/or 300. Further, the method 800 can similarly include similarly receiving, storing, and utilizing the threshold during operation of the apparatus 200 and/or 300. In other embodiments, the method 800 can include accessing the targeted command, the threshold, or a combination thereof that are predetermined before operation of the apparatus 200 and/or 300.

In some embodiments, the method 800 can include authenticating based on timed authentication as described above. For example, the method 800 can include receiving a clock signal, resetting the count in response to receiving the authentication command, and incrementing the count based on the clock signal. The clock signal can be received from a source common to both the host and the apparatus or from a local source that is synchronized with the host.

In some embodiments, the method 800 can include locking functional operations of the memory device when the count exceeds the threshold. In other words, the method 800 can include ignoring commands that are received when and/or after the count exceeds the threshold. The method 800 can further include resetting the error, thereby transitioning from the locked state to an unlocked state, based on detecting a preset condition, such as receiving of a reset command/input. Accordingly, the method 800 can include permitting execution of commands that follow the reset command.

The apparatus including the security mechanism (e.g., the controller tracking circuit 212 and/or the memory tracking circuit 214) can provide improved security from unauthorized device-level access. As described above, the memory 204 can receive nefarious commands 862, such as from the nefarious device 208 of FIG. 2 and/or from the system 100 of FIG. 1. However, since the nefarious actor would not have access to the security mechanism, the unauthorized access will continue to increment the memory operational measure without an authorization command. Accordingly, the unauthorized access can lead to the memory operational measure matching and/or exceeding the threshold. Even when the unauthorized access does not increase the measure to the point of matching/exceeding the threshold, the memory operational measure would mismatch the controller operational measure. As such, the controller 202 will fail to timely issue the authorization command, thereby leading to the memory operational measure matching/exceeding the threshold. Based on the violation, the memory 204 can stop the functional operation to prevent further unauthorized access, and/or the controller 202 can implement mitigation operations as described above.

FIG. 9 is a schematic view of a system that includes an apparatus in accordance with embodiments of the present technology. Any one of the foregoing apparatuses (e.g., memory devices) described above with reference to FIGS. 2-8 can be incorporated into any of a myriad of larger and/or more complex systems, a representative example of which is system 980 shown schematically in FIG. 9. The system 980 can include a memory device 900, a power source 982, a driver 984, a processor 986, and/or other subsystems or components 988. The memory device 900 can include features generally similar to those of the apparatus described above with reference to FIGS. 2-8, and can therefore include various features for performing a direct read request from a host device. The resulting system 980 can perform any of a wide variety of functions, such as memory storage, data processing, and/or other suitable functions. Accordingly, representative systems 980 can include, without limitation, hand-held devices (e.g., mobile phones, tablets, digital readers, and digital audio players), computers, vehicles, appliances and other products. Components of the system 980 may be housed in a single unit or distributed over multiple, interconnected units (e.g., through a communications network). The components of the system 980 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the apparatuses have been described in the context of DRAM devices. Apparatuses configured in accordance with other embodiments of the present technology, however, can include other types of suitable storage media in addition to or in lieu of DRAM devices, such as, devices incorporating NAND-based or NOR-based non-volatile storage media (e.g., NAND flash), magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structure includes information arranged as bits, words or code-words, blocks, files, input data, system-generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 2-9.

We claim:

1. A memory device, comprising:
    an input/output circuit configured to receive commands from a memory controller coupled to the memory device;
    a command validation circuit coupled to the input/output circuit and configured to identify an authentication command in the received commands; and
    a tracking circuit coupled to the command validation circuit and configured to:
        track a count of one or more types of command amongst the received commands and/or a clock signal following receipt of the authentication command, wherein the count is tracked by incrementing the count each time one of the received commands matches a targeted command,
        compare the count to a threshold, and
        generate an error when the count exceeds the threshold.

2. The memory device of claim 1, wherein the tracking circuit is configured to:
    store a lithe targeted command,
    reset the count in response to receiving the authentication command,
    compare the received commands following the authentication command to the targeted command, and
    increment the count when one of the received commands matches the targeted command after resetting the count.

3. The memory device of claim 2, wherein the tracking circuit is further configured to:
    compare the count to the threshold, and
    generate an error status when the command count exceeds the threshold, wherein the error status represents an unauthorized access to the memory device.

4. The memory device of claim 1, wherein the targeted command, the threshold, or a combination thereof are dynamically set during operation of the memory device.

5. The memory device of claim 1, wherein the targeted command, the threshold, or a combination thereof are predetermined before operation of the memory device.

6. The memory device of claim 1, wherein the targeted command is a precharge command, an activate command, a read command, and/or a write command.

7. The memory device of claim 1, wherein the authentication command includes a key for validating the received command.

8. The memory device of claim 1, wherein the tracking circuit is configured to:
    receive the clock signal,
    reset the count in response to receiving the authentication command, and
    increment the count based on the clock signal.

9. The memory device of claim 8, wherein the clock signal represents a measure of time synchronized with a host device that comprises the memory controller.

10. The memory device of claim 8, further comprising an oscillator configured to generate the clock signal.

11. The memory device of claim 1, further comprising a disable circuit configured to lock functional operations of the memory device when the count exceeds the threshold, wherein locking the functional operations includes ignoring subsequently received commands.

12. The memory device of claim 11, wherein the disable circuit is configured to reset the error based on detecting a predetermined reset command.

13. The memory device of claim 12, wherein the resetting the error represents an unlocked state, wherein subsequently received commands are permitted to be executed in the unlocked state.

14. The memory device of claim 1, wherein the memory device is a dynamic random-memory (DRAM) device.

15. The memory device of claim 1, wherein the targeted command is an input-output type of command associated with reading or writing data on the memory device.

16. A memory system, comprising:
    a controller configured to:
        send commands for processing data, wherein the commands include an authentication command, and
        track a controller count following transmission of the authentication command; and
    a memory device coupled to the controller and configured to:
        receive the commands from the controller,
        validate the authentication command in the received commands,
        track a memory count following receipt of the authentication command,
        compare the memory count to a threshold, and
        generate an error when the count exceeds the threshold.

17. The system of claim 16, wherein:
    the controller is configured to track the controller count based on counting targeted commands included in the sent commands following the authentication command; and
    the memory device is configured to track the memory count based on counting the targeted commands included in the received commands following the authentication command.

18. The system of claim 16, wherein:
    the controller includes:
        a first oscillator configured to generate a first clock signal, and
        a controller tracking circuit configured to track the controller count based on counting cycles of the first clock signal; and
    the memory device includes:
        a second oscillator configured to generate a second clock signal synchronous with the first clock signal, and
        a memory tracking circuit configured to track the memory count based on counting cycles of the second clock signal.

19. The system of claim 16, wherein:
    the controller is configured to track the controller operational measure based on a common clock signal, wherein the controller operational measure represents a duration measured at the controller following the authentication command; and
    the memory device is configured to track the memory operational measure based on the common clock signal, wherein the controller operational measure represents a duration measured at the memory device following the authentication command.

20. The system of claim 16, wherein the memory device is configured to lock functional operations when the memory count exceeds a threshold, wherein locking the functional operations includes ignoring subsequently received commands.

21. The system of claim 20, wherein:

the memory device is configured to send an error status to the controller when the memory operational measure exceeds the threshold; and the controller is configured to identify the occurrence of the unauthorized access to the memory device based on the error status.

22. A method comprising:

receiving one or more commands from a memory controller at a memory device;

tracking a count of one or more types of command amongst the received commands by incrementing the count each time one of the received commands matches a targeted command;

determining that the count exceeds a threshold number of commands; and operating the memory device in a different mode based at least in part on determining that the count exceeds the threshold, wherein operation in the different mode comprises taking no action in response to one or more commands received beyond the threshold number.

* * * * *